US008094290B2

(12) United States Patent
Owa et al.

(10) Patent No.: US 8,094,290 B2
(45) Date of Patent: Jan. 10, 2012

(54) ILLUMINATION OPTICAL APPARATUS, EXPOSURE APPARATUS, AND DEVICE MANUFACTURING METHOD

(75) Inventors: Soichi Owa, Kumagaya (JP); Osamu Tanitsu, Kumagaya (JP); Hirohisa Tanaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 369 days.

(21) Appl. No.: 12/266,321

(22) Filed: Nov. 6, 2008

(65) Prior Publication Data

US 2009/0115990 A1     May 7, 2009

Related U.S. Application Data

(60) Provisional application No. 60/996,404, filed on Nov. 15, 2007.

(30) Foreign Application Priority Data

Nov. 6, 2007    (JP) .................................. 2007-289089

(51) Int. Cl.
    *G03B 27/54*      (2006.01)
    *G03B 27/72*      (2006.01)
    *G03B 27/32*      (2006.01)
(52) U.S. Cl. ................................ 355/67; 355/71; 355/77
(58) Field of Classification Search .................... 355/71, 355/67
See application file for complete search history.

(56) References Cited

U.S. PATENT DOCUMENTS

| 5,312,513 | A | 5/1994 | Florence et al. |
| 5,754,305 | A | 5/1998 | DeClerck et al. |
| 6,133,986 | A | 10/2000 | Johnson |
| 6,285,488 | B1 * | 9/2001 | Sandstrom .................... 359/290 |
| 6,483,573 | B1 * | 11/2002 | Schuster ......................... 355/71 |
| 6,737,662 | B2 | 5/2004 | Mulder et al. |
| 6,885,493 | B2 | 4/2005 | Ljungblad et al. |
| 6,891,655 | B2 | 5/2005 | Grebinski et al. |
| 6,900,915 | B2 | 5/2005 | Nanjyo et al. |
| 6,958,806 | B2 * | 10/2005 | Mulder et al. .................. 355/68 |
| 7,015,491 | B2 | 3/2006 | Eurlings et al. |

(Continued)

FOREIGN PATENT DOCUMENTS

DE     10 2005 037 764 A1     2/2007

(Continued)

OTHER PUBLICATIONS

Search Report and Search Opinion issued in corresponding European Application No. 08846939.0 dated May 6, 20011.

*Primary Examiner* — Edward Glick
*Assistant Examiner* — Michelle Iacoletti
(74) *Attorney, Agent, or Firm* — Miles & Stockbridge P.C.

(57) ABSTRACT

An illumination optical system with a simple structure reduces the effects of illumination variations caused by a spatial coherency of illumination light, while maintaining a high usage efficiency of illumination light that is emitted in pulses. The illumination optical system illuminates an irradiated plane with pulse-emitted illumination light and includes a spatial light modulator including a plurality of mirror elements each of which spatially modulates the illumination light in accordance with an incident position of the illumination light. A modulation control unit controls the mirror elements, whenever at least one pulse of illumination light is emitted, in a manner such that the optical elements spatially modulate the pulses of illumination light differently from one another and form substantially the same intensity distribution for the pulses of illumination light on a predetermined plane.

20 Claims, 7 Drawing Sheets

U.S. PATENT DOCUMENTS

| | | |
|---|---|---|
| 7,095,546 B2 | 8/2006 | Mala et al. |
| 2003/0077089 A1 | 4/2003 | Luellau |
| 2003/0210383 A1 | 11/2003 | Bjorklund et al. |
| 2004/0150868 A1 | 8/2004 | Ljungblad et al. |
| 2004/0239908 A1* | 12/2004 | Bleeker et al. .............. 355/67 |
| 2005/0095749 A1 | 5/2005 | Krellmann et al. |
| 2005/0175302 A1 | 8/2005 | Ishikawa et al. |
| 2006/0055834 A1 | 3/2006 | Tanitsu et al. |
| 2006/0055905 A1 | 3/2006 | Baselmans et al. |
| 2006/0103914 A1* | 5/2006 | Sandstrom .............. 359/291 |
| 2006/0138349 A1 | 6/2006 | Bleeker et al. |
| 2006/0139599 A1 | 6/2006 | Kruijswijk et al. |
| 2007/0013888 A1 | 1/2007 | Flagello et al. |
| 2007/0165202 A1 | 7/2007 | Koehler et al. |
| 2007/0273853 A1 | 11/2007 | Bleeker et al. |
| 2007/0291240 A1 | 12/2007 | Hintersteiner et al. |
| 2008/0025304 A1 | 1/2008 | Venkataswami et al. |
| 2008/0079930 A1 | 4/2008 | Klarenbeek |
| 2008/0239268 A1 | 10/2008 | Mulder et al. |

FOREIGN PATENT DOCUMENTS

| | | |
|---|---|---|
| EP | 0 779 530 A1 | 6/1997 |
| JP | 6-281869 A | 10/1994 |
| JP | 6-291023 A | 10/1994 |
| JP | 8-313842 A | 11/1996 |
| JP | 10-503300 A | 3/1998 |
| JP | 11-003849 A | 1/1999 |
| JP | 2002-353105 A | 12/2002 |
| JP | 2004-78136 A | 3/2004 |
| JP | 2004-520618 A | 7/2004 |
| JP | 2005-524112 A | 8/2005 |
| JP | 2006-113437 A | 4/2006 |
| JP | 2006-513442 A | 4/2006 |
| JP | 2006-524349 A | 10/2006 |
| WO | WO 99/49504 A1 | 9/1999 |
| WO | WO 2004/051717 A1 | 6/2004 |
| WO | WO 2006/097135 A | 9/2006 |
| WO | WO 2007/060834 A1 | 5/2007 |
| WO | WO 2008/131928 A | 4/2008 |
| WO | WO 2008/061681 A | 5/2008 |

* cited by examiner

ILLUMINATION OPTICAL APPARATUS, EXPOSURE APPARATUS, AND DEVICE MANUFACTURING METHOD

CROSS-REFERENCE TO RELATED APPLICATIONS

This application claims the benefit of Japanese Patent Application No. 2007-289089, filed on Nov. 6, 2007 and U.S. Provisional Application No. 60/996,404, filed on Nov. 15, 2007.

BACKGROUND

The present invention relates to an illumination technique for illuminating an irradiated plane using a plurality of optical elements, each of which is capable of spatially modulating light, an exposure technique using such an illumination technique, and a method for manufacturing a device with such an exposure technique.

In a lithography process for manufacturing devices (electronic devices and micro-devices), such as semiconductor devices and liquid crystal display devices, an exposure apparatus such as a batch exposure type projection exposure apparatus, like a stepper, or a scanning exposure type projection exposure apparatus, like a scanning stepper, is used to transfer a predetermined pattern onto a wafer (or glass plate etc.). Exposure wavelengths used in such an exposure apparatus have been shortened to increase the resolution. Excimer laser lights, such as a KrF excimer laser (wavelength, 248 nm) and an ArF excimer laser (wavelength, 193 nm) are nowadays being used as exposure light. Further, $F_2$ laser (wavelength, 157 nm) is also being considered for use as exposure light.

To accurately transfer a fine pattern onto a wafer, an illumination optical system of recent exposure apparatuses is required to illuminate a reticle pattern (or mask pattern) with the optimal light intensity distribution (intensity distribution). For example, one promising technique for improving the focal depth and the resolution of a projection optical system is deformed illumination, which forms an annular or multipolar (for example, dipolar or quadrupolar) light intensity distribution on an illumination pupil plane of an illumination optical system. As one such technique, to convert light from a light source to light having an annular or multipolar light intensity distribution on an illumination pupil plane of an illumination optical system, an exposure apparatus includes a spatial light modulator including a two-dimensional array of a plurality of micromirror elements (for example, a digital micromirror device (DMD)). Such an exposure apparatus changes the inclination angle and the inclination direction of each mirror element to form a predetermined light intensity distribution on an illumination pupil plane of the illumination optical system or a plane conjugated with the illumination pupil plane (refer to, for example, Japanese Laid-Open Patent Publication No. 2002-353105).

SUMMARY

However, the inventors of the present application have found that in the above exposure apparatus (for example, the stepper, the scanning stepper), the laser light emitted from a laser light source includes a speckle pattern generated by a high spatial coherency of the laser light or light intensity distribution variations in the cross-section of a laser beam.

Accordingly, it is an object of the present invention to provide an illumination technique that reduces effects of such illumination variations, an exposure technique using such an illumination technique, and a method for manufacturing a device.

One aspect of the present invention is an illumination optical apparatus for illuminating an irradiated plane with pulses of light. The illumination optical apparatus includes an optical device arranged upstream from the irradiated plane (toward the light source of the pulses of light) and including a plurality of optical elements, each of which spatially modulates a pulse of light in accordance with an incident position of the pulse of light. An illumination control system controls the plurality of optical elements, whenever at least one pulse of light is emitted, in a manner that the optical elements spatially modulate the plurality of pulses of light differently from one another manner and forms substantially the same intensity distribution of the spatially modulated pulses of light on a predetermined plane.

The apparatus according to one aspect of the present invention reduces effects of illumination variations by using the plurality of optical elements, each of which spatially modulates the pulses of light differently (or by controlling the plurality of optical elements separately from one another) whenever at least one pulse of light is emitted.

DETAILED DESCRIPTION OF THE PREFERRED EMBODIMENTS

An embodiment of the present invention will now be discussed with reference to FIGS. 1 to 6.

Figure 1:
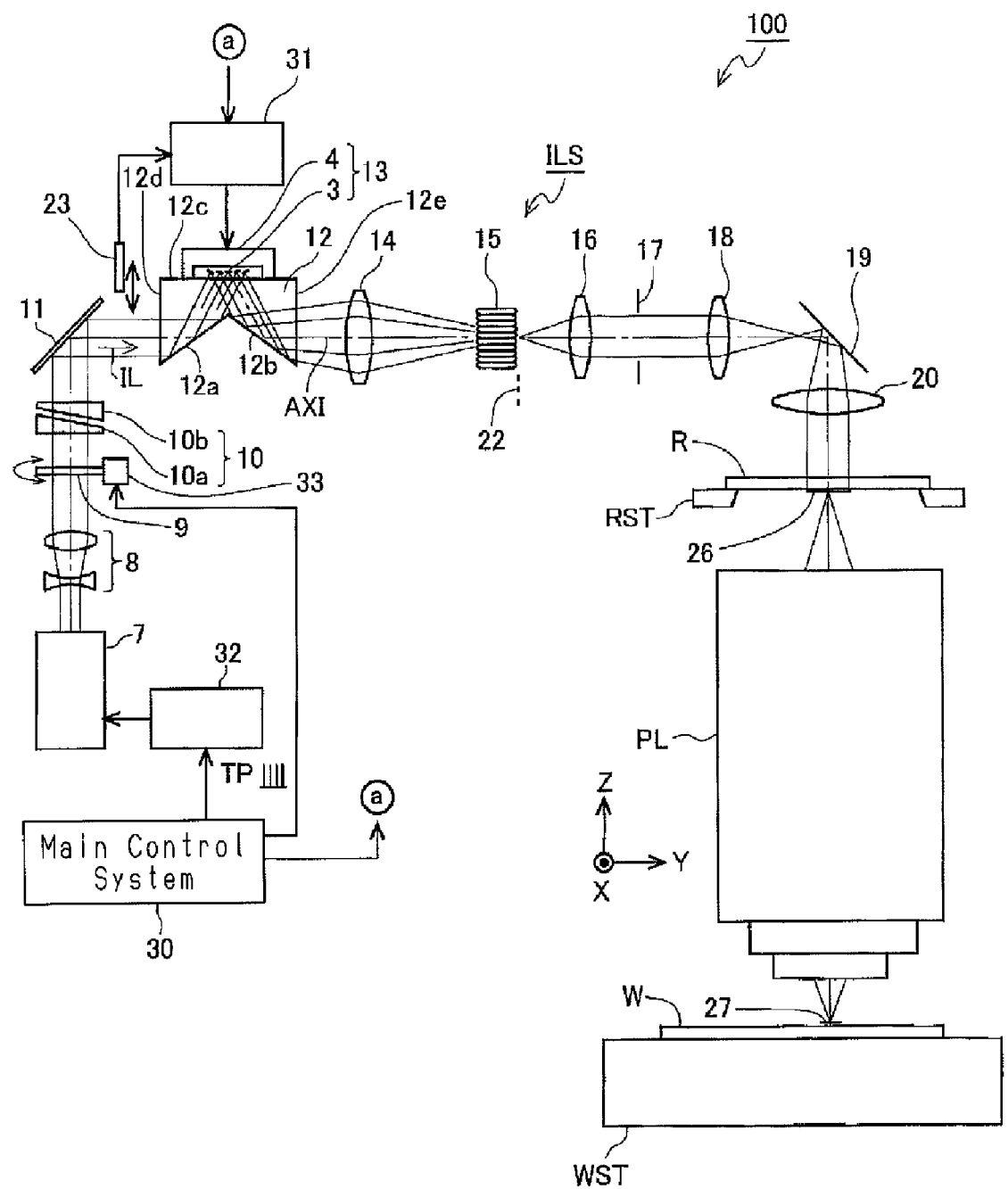
FIG. 1 is a schematic diagram showing one example of the structure of an exposure apparatus according to an embodiment of the present invention.

FIG. 1 is a schematic diagram showing the structure of a scanning exposure type exposure apparatus (projection exposure apparatus) 100 of the embodiment of the present invention formed using a scanning stepper. In FIG. 1, the exposure apparatus 100 includes an exposure light source 7 for performing pulsed illumination, an illumination optical system ILS for illuminating a pattern surface (irradiated plane) of a reticle R (mask) with exposure illumination light (exposure light) IL from the light source 7, a reticle stage RST for positioning and moving the reticle R, a projection optical system PL for projecting a pattern image of the reticle R onto a wafer W (photosensitive substrate), a wafer stage WST for positioning and moving the wafer W, a main control system 30 employing a computer for central-controlling the operation of the entire apparatus, and various types of control systems. In FIG. 1, a direction orthogonal to a guide surface (not shown) of the wafer stage WST is set as the Z axis, a direction parallel to the plane of FIG. 1 in a plane orthogonal to the Z axis is set as the Y axis, and a direction orthogonal to the plane of FIG. 1 is set as the X axis. In the present embodiment, the reticle R and the wafer W are scanned in the Y direction (scanning direction) during exposure.

The light source 7 of FIG. 1 can be an ArF excimer laser light source which emits pulses of light having substantially linear polarization and a wavelength of 193 nm and a pulse width of about 50 ns at a frequency of 4 to 6 kHz. As the light source 7, a KrF excimer laser light source generating pulses of light having a wavelength of 248 nm, an $F_2$ laser light source generating pulses of light having a wavelength of 157 nm, and a light-emitting diode generating pulses of light may also be used. Further, as the light source 7, a solid pulse laser light source that generates high harmonic wave laser light output from a YAG laser, semiconductor laser, or the like may be used. Alternatively, a solid pulse laser light source that generates high harmonic wave laser light by amplifying semiconductor laser light with a fiber amplifier can be used. A solid pulse laser light source, for example, emits pulse laser lights having a wavelength of 193 nm (other wavelengths are also possible) and a pulse width of about 1 ns at a frequency of 1 to 2 MHz.

In the present embodiment, a power supply control unit 32 is connected to the light source 7. The main control system 30 of the exposure apparatus 100 provides the power supply control unit 32 with a light emission trigger pulse TP, which is for instructing the timing and light intensity (pulse energy) of the pulse of light emissions. In synchronism with the light emission trigger pulse TP, the power supply control unit 32 emits pulses of light in accordance with the instructed timing and light intensity from the light source 7.

The illumination light IL, which includes substantially linear polarization laser light of substantially parallel light beams having a cross-section with a rectangular light distribution, enters a beam expander 8, which includes a concave lens and a convex lens, and is expanded by the beam expander 8. The illumination light IL emitted from the beam expander 8 travels through a polarization optical system including a half-wavelength plate 9 (polarization control member), which rotates the polarization direction of the illumination light IL by one of a plurality of predetermined angles, and a depolarizer 10, which randomly polarizes (nonpolarizes) the illumination light IL in the illumination optical system ILS having the optical axis AXI. The depolarizer 10 includes a wedge-shaped first prism 10a, which is made from a double reflex material (for example, crystal), and a second prism 10b, which has a shape complementary to the shape of the first prism 10a and is made from a material free of a double refraction property (for example, quartz).

In one example, the polarization direction of the illumination light IL entering the half-wavelength plate 9 is the X direction. The direction of the crystal axis of the half-wavelength plate 9 in an initial state is the X direction. The direction of a first crystal axis, which is one of the two perpendicular crystal axes of the first prism 10a included in the depolarizer 10, is the X direction. In this case, the illumination light IL is converted to linearly polarized light in the X direction or the Y direction after traveling through the depolarizer 10 by rotating the half-wavelength plate 9 about the optical axis AXI by 0° or 45° (the polarization direction is rotated by 90°) from the initial state. Also, the illumination light IL is converted to nonpolarized light after traveling through the depolarizer 10 by rotating the half-wavelength plate 9 by 22.5° about the optical axis AXI (the polarization direction is rotated by 45°) from the initial state. The structure and the operation of the polarization optical system including the half-wavelength plate 9 and the depolarizer 10 are described in detail in PCT Publication No. 2004/051717.

In the present embodiment, the exposure apparatus 100 includes a drive unit 33 for rotating the half-wavelength plate 9 at a high speed in a manner that the half-wavelength plate 9 is rotated about the optical axis AXI by 0°, 22.5°, and 45° from the initial state whenever a predetermined number of pulses or k pulses (k is an integer greater than of equal to 1) of the illumination light IL are emitted. The drive unit 33 may include a rotatable holding member for holding the half-wavelength plate 9 and a movable coil type motor for rotating the holding member by 0°, ±22.5°, and ±45°. The main control system 30 controls the rotation angle of the half-wavelength plate 9 with the drive unit 33 to control the polarization state of the illumination light IL emitted from the depolarizer 10, and ultimately, the polarization state of the illumination light IL illuminating the reticle R (wafer W), to be in a linearly polarized state in which the polarization direction is the X direction or the Y direction or in a nonpolarized state whenever k pulses of the illumination light IL are emitted.

The illumination light IL that has traveled through the depolarizer 10 is reflected in the +Y direction by an optical path deflection mirror 11 and then travels along the optical axis AXI to enter an incident surface 12d of a prism 12, of which incident surface 12d and emission surface 12e are orthogonal to the optical axis AXI. The prism 12 is made from an optical material, such as fluorite ($CaF_2$) or silica, which transmits the illumination light IL. In one example, the prism 12 has a first reflection surface 12a intersecting the incident surface 12d at about 60° in the clockwise direction about an axis parallel to the X axis, a second reflection surface 12b substantially symmetric to the first reflection surface 12a and a plane parallel to the XZ plane, and a transmission surface 12c parallel to the XY plane and orthogonal to the incident surface (12d) (emission surface 12e).

A spatial light modulator 13 is arranged near the prism 12. The spatial light modulator 13 includes a plurality of mirror elements 3, which are micro-mirrors with variable inclination angles arranged in a two-dimensional array, and a drive unit 4 for driving the mirror elements 3. The plurality of mirror elements 3 in the spatial light modulator 13 are entirely arranged substantially parallel to and near the transmission surface 12c. The inclination angle of the reflection surface of each mirror element 3 about two axes parallel to the X axis and the Y axis (two perpendicular axes) can be controlled substantially continuously within a predetermined variable range. In one example, the reflection surface of each mirror element 3 is substantially parallel to the transmission surface 12c in the middle of the variable range. The main control system 30 provides information on the illumination conditions and information on the illumination timing of the illumination light IL to a modulation control unit 31. The modulation control unit 31 controls the drive unit 4 to cyclically switch the distribution of inclination angles of the plurality of mirror elements 3 about the two axes among a plurality of states (described later) while maintaining the illumination conditions, whenever at least one pulse of the illumination light IL is emitted. The spatial light modulator 13 forms a desired pupil brightness distribution in its far field.

In this case, the illumination light IL entering the incident surface 12d of the prism 12 in a direction parallel to or substantially parallel to the optical axis AXI is totally reflected by the first reflection surface 12a and then travels through the transmission surface 12c to enter the plurality of mirror elements 3 of the spatial light modulator 13. The illumination light IL reflected by the plurality of mirror elements 3 again enters the transmission surface 12c, and then is totally reflected by the second reflection surface 12b and emitted from the emission surface 12e. The angle of the first reflection surface 12a to the incident surface 12d may be any angle in a range in which the light beam entering the incident surface 12d at a right angle is totally reflected by the first reflection surface 12a and the light beam totally reflected by the first reflection surface 12a travels through the transmission surface 12c. When the reflection surface of any mirror element 3 is substantially parallel to the transmission surface 12c, the illumination light IL reflected by the mirror element 3 travels through the transmission surface 12c and is then totally reflected by the second reflection surface 12b and emitted from the emission surface 12e in a direction substantially parallel to the optical axis AXI. Thus, the angle of the illumination light IL in the two perpendicular directions reflected by each mirror element 3 and emitted from the prism 12 with respect to the optical axis AXI can be controlled by controlling the inclination angle of each mirror element 3 about the two axes. In the present embodiment, spatial modulation performed using each mirror element 3 is achieved by controlling the angle of the illumination light IL to the optical axis AXI in the manner described above. The distribution of angles of the illumination light IL from each mirror element 3 to the optical axis AXI corresponds to a single illumination control pattern.

In this manner, although the reflection surfaces 12a and 12b of the prism 12 totally reflect the illumination light IL, a reflection film may be formed on each of the reflection surfaces 12a and 12b to reflect the illumination light IL.

The illumination light IL emitted from the prism 12 enters a fly's eye lens 15 (optical integrator) after traveling through a relay optical system 14. In one example, the reflection surface of each mirror element 3 is arranged on substantially a front focal plane of the relay optical system 14, and the incident surface of the fly's eye lens 15 is arranged on substantially a rear focal plane of the relay optical system 14. However, the present invention is not limited to this arrangement of the mirror elements 3 and the fly's eye lens 15.

Figure 3A:
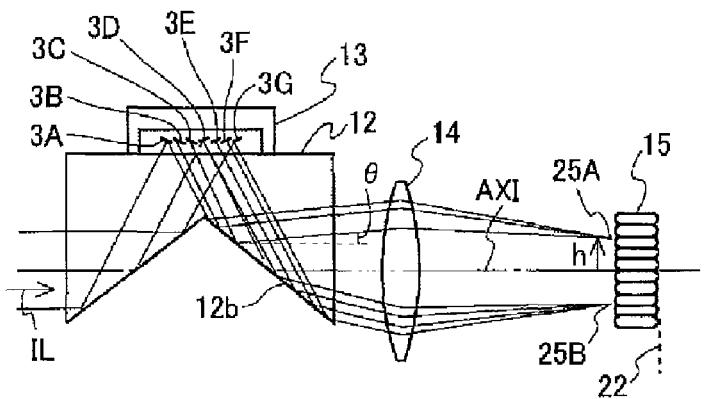
FIG. 3(A) is a diagram showing the inclination angles of mirror elements included in the spatial light modulator 13 of FIG. 1 during dipolar illumination.

FIG. 3(A) shows the optical system from the prism 12 to the fly's eye lens 15 of FIG. 1. In FIG. 3(A), θ indicates the inclination angle of a light beam entering the relay optical system 14 to the optical axis AXI, and f indicates the rear focal length of the relay optical system 14. In this case, for example, the height h from the optical axis AXI to a position at which the light beam is focused on the incident surface of the fly's eye lens 15 is expressed as shown below.

$$h = f * \tan\theta \quad (1)$$

In FIG. 1, the relay optical system 14 functions to change the angle and position of the illumination light IL reflected by each mirror element 3 at a position on the incident surface of the fly's eye lens 15 in the X and Z directions defined by the angles of the illumination light IL in the two perpendicular directions to the optical axis AXI.

In other words, the illumination light IL entering the spatial light modulator 13 after traveling through the prism 12 is divided in units of the mirror elements 3 and polarized (reflected) in a predetermined direction at a predetermined angle in accordance with the inclination direction and the inclination angle of each mirror element 3. The reflection light from each mirror element 3 can be focused by the prism 12 and the relay optical system 14 at any position on the incident surface of the fly's eye lens 15 in accordance with the direction and the angle in which the illumination light IL is polarized (reflected).

The illumination light IL entering the fly's eye lens 15 is divided two-dimensionally by the plurality of lens elements so as to form light sources at rear focal planes of the lens elements. In this manner, on a pupil plane (illumination pupil plane 22) of the illumination optical system ILS, which serves as the rear focal plane of the fly's eye lens 15, secondary light sources having substantially the same light intensity distribution as the illumination fields are formed by the light beams entering the fly's eye lens 15, that is, secondary light sources are formed by substantially planar light sources. In the present embodiment, the light intensity distribution on the incident surface of the fly's eye lens 15, and ultimately the light intensity distribution of the secondary light sources formed on the illumination pupil plane 22, can be controlled substantially freely by separately controlling the mirror elements 3 with respect to the inclination direction and the inclination angle of their reflection surfaces in the spatial light modulator 13.

Figure 3B:
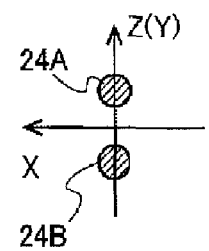
FIG. 3(B) is a diagram showing secondary light sources during dipolar illumination.
Figure 4A:
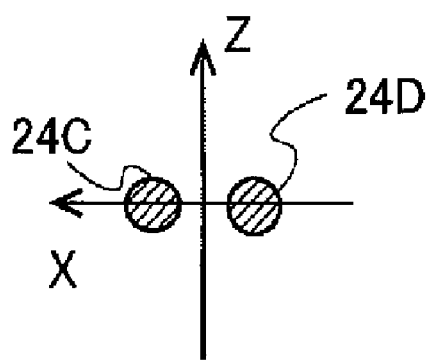
FIG. 4(A) is a diagram showing other secondary light sources during dipolar illumination.

When, for example, a line and space pattern formed to have a fine pitch near a resolution limit in the Y direction (or X direction) on the pattern surface (reticle surface) of the reticle R of FIG. 1 is mainly exposed, secondary light sources on the illumination pupil plane 22 are set to be dipolar secondary light sources 24A and 24B in the Z direction (corresponding to the Y direction of the reticle surface) in FIG. 3(B) (or dipolar secondary light sources 24C and 24D in the X direction in FIG. 4(A)). In the same manner, the secondary light sources on the illumination pupil plane 22 can be set to have any intensity distribution by the spatial light modulator 13, such as a circular secondary light source 28A for normal illumination shown in FIG. 4(B), a secondary light source 28B in annular illumination shown in FIG. 4(C), or secondary light sources 24E to 24H in quadrupolar illumination shown in FIG. 4(D). Further, in FIG. 3(B) for example, the interval of the secondary light sources 24A and 24B and/or the size of each of the secondary light sources 24A and 24B can be changed freely using the spatial light modulator 13.

In the present embodiment, the reticle R (mask) arranged on the irradiated plane undergoes Köhler illumination. Thus, the plane on which the above secondary light sources are formed is conjugated with an aperture stop (not shown) of the projection optical system PL and serves as the illumination pupil plane 22 of the illumination optical system ILS. The irradiated plane (surface on which the reticle R or the wafer W is arranged) for the illumination pupil plane 22 serves as an optically Fourier transform plane. The pupil brightness distribution refers to brightness distribution on the illumination pupil plane 22 of the illumination optical system ILS or on a plane conjugated with the illumination pupil plane 22. When the wavefront divisional number of the fly's eye lens 15 is large, the brightness distribution formed in a broad range on the incident surface of the fly's eye lens 15 has high correlations with the brightness distribution (pupil brightness distribution) formed in a broad range in the secondary light sources. Thus, the brightness distribution on the incident surface of the fly's eye lens 15 and the plane conjugated with the incident surface can also be considered as the pupil brightness distribution.

Instead of the fly's eye lens 15, a microlens array may be used.

In FIG. 1, the illumination light IL from the secondary light sources formed on the illumination pupil plane 22 travels through the first relay lens 16, a reticle blind (field stop) 17, a second relay lens 18, an optical path deflection mirror 19, and a condenser optical system 20 to illuminate a rectangular illumination region 26 elongated in the X direction on a pattern surface (lower surface) of the reticle R in a superimposed manner. For example, the illumination light IL is laser light with a high spatial coherency. Thus, the illumination light IL may form random interference fringes with a fine pitch, such as a speckle pattern, in the illumination region 26. This would cause illumination variations. The elimination of such illumination variations will be described later. The optical components from the beam expander 8 to the condenser optical system 20 form the illumination optical system ILS. The optical components of the illumination optical system ILS including the spatial light modulator 13 are supported by a frame (not shown).

An image sensor having a light receiving surface large enough to cover the cross-section of the illumination light IL, such as a two-dimensional charge-coupled device (CCD) or a complementary metal oxide semiconductor (CMOS), or a photoelectric sensor 23 formed for example by a two-dimensional photo diode array, is removably arranged in an optical path of the illumination light IL between the mirror 11 and the prism 12 in FIG. 1. The photoelectric sensor 23 is fixed on a slider (not shown) movably supported on the frame and provides a detection signal to the modulation control unit 31. With the photoelectric sensor 23 arranged in the optical path of the illumination light IL, the illumination light IL is emitted in pulses, and the modulation control unit 31 receives a detection signal corresponding to each pixel (each light receiving element) of the photoelectric sensor 23. This enables the modulation control unit 31 to measure the intensity ratio of the illumination light IL entering each mirror element 3 (assuming, for example, the intensity of the light entering the mirror element 3 arranged in the middle to be 1). With the intensity ratio obtained in this manner, the intensity distribution of the secondary light sources on the illumination pupil plane 22 can be set with a higher accuracy (described later in detail).

The pattern in the illumination region 26 on the reticle R is projected with a predetermined projection magnification (for example, ¼, ⅕, etc.) by the two-side telecentric projection optical system PL (or one-side at the wafer) into an exposure region 27 in a single shot region of the wafer W, to which resist (photosensitive material) is applied.

The reticle R is attracted to and held on the reticle stage RST. The reticle stage RST is movable along a guide surface of a reticle base (not shown) at a constant speed and movable at least in the X direction, the Y direction, and a rotation direction about the Z axis. The two-dimensional position of the reticle stage RST is measured by a laser interferometer (not shown). Based on information on the measured position of the reticle stage RST, the main control system 30 controls the position and the speed of the reticle stage RST with a drive system (not shown), such as a linear motor.

The wafer W is attracted to and held by the wafer stage WST with a wafer holder (not shown). The wafer stage WST is step-moved along a guide surface (not shown) in the X direction and the Y direction and is movable at a constant speed in the Y direction. The two-dimensional position of the wafer stage WST on the guide surface is measured by a laser interferometer (not shown). Based on information on the measured position of the wafer stage WST, the main control system 30 controls the position and the speed of the wafer stage WST with a drive system (not shown), such as a linear motor. To align the wafer W, the exposure apparatus 100 also includes an alignment system (not shown) or the like for detecting the alignment marks on the wafer W.

When the wafer W is exposed by the exposure apparatus 100, the main control system 30 selects the illumination conditions (for example, the intensity distribution of the secondary light sources on the illumination pupil plane 22) in accordance with the pattern of the reticle R and sets the selected illumination conditions in the modulation control unit 31. Based on the set conditions, the modulation control unit 31 sets the intensity distribution of the secondary light sources on the illumination pupil plane 22 by separately controlling the inclination direction and the inclination angle of each mirror element 3 in the spatial light modulator 13. The wafer stage WST then step-moves to move the wafer W to a scanning initiation position. Subsequently, the light source 7 starts emitting pulses of light. In synchronization with movement of the reticle R with respect to the illumination region 26 in the Y direction with the reticle stage RST, the wafer W is moved with the wafer stage WST in the corresponding direction with respect to the exposure region 27 at a speed ratio corresponding to the projection magnification. This scans and exposes a single shot region of the wafer W. In this manner, the step and scan operation of repeating step movements and scanning exposure of the wafer W exposes the pattern image of the reticle R onto all shot regions of the wafer W.

During the exposure, random interference fringes of the illumination light IL having a fine pitch, such as a speckle pattern, are formed in the illumination region 26 of the reticle R, and ultimately in the exposure region 27 of the wafer W conjugated with the illumination region 26 with respect to the projection optical system PL. The interference fringes may cause illumination variations in the illumination region 26 of the reticle R. Further, such interference fringes may also cause variations in the exposure of the wafer W (variations in the accumulated exposure after scanning exposure of each shot region).

In the present embodiment, the inclination direction and the inclination angle of the plurality of mirror elements 3 of the spatial light modulator 13 in the illumination optical system ILS of FIG. 1 are controlled cyclically to have a plurality of different distributions whenever at least one pulse of the illumination light IL is emitted, or for example, whenever m pulses of the illumination light IL are emitted (m is an integer greater than or equal to 1). The integer m may be set to change gradually during a single scanning exposure operation.

The structure and operation of the spatial light modulator 13 of FIG. 1 will now be described.

Figure 2A:
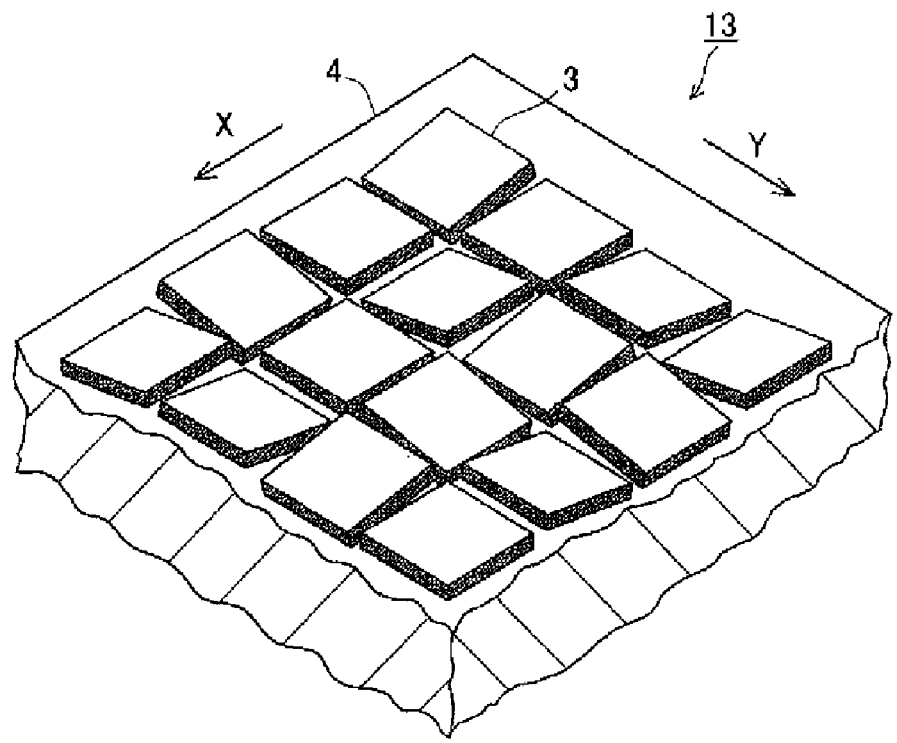
FIG. 2(A) is a partially enlarged perspective view of a spatial light modulator 13 of FIG. 1.

FIG. 2(A) is a partially enlarged perspective view of the spatial light modulator 13. In FIG. 2(A), the spatial light modulator 13 includes the plurality of mirror elements 3, which are arranged so as to substantially come in contact with one another with a fixed pitch in the X direction and the Y direction, and the drive unit 4, which separately controls the angle of the reflection surface of each of the plurality of mirror elements 3. In one example, several thousand mirror elements 3 may be arranged in each of the X direction and Z direction.

Figure 2B:
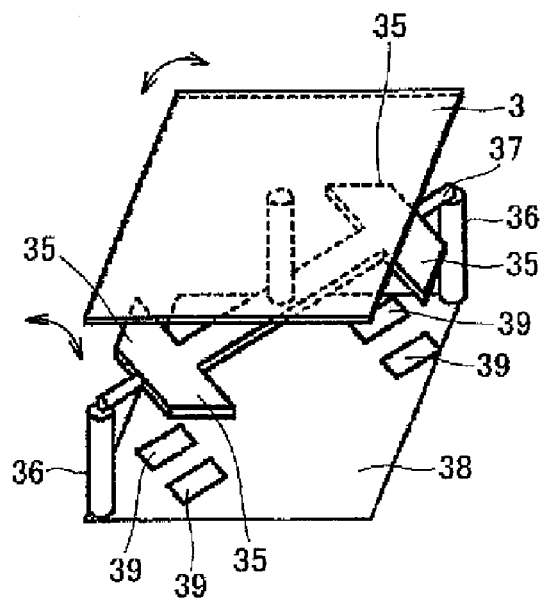
FIG. 2(B) is an enlarged perspective view of a drive mechanism of a mirror element 3 of FIG. 1.

As shown in FIG. 2(B), a drive mechanism of the mirror elements 3 includes a hinge member 37 supporting the mirror elements 3, four electrodes 35 arranged to project on the hinge member 37, a supporting substrate 38, a pair of supporting members 36 supporting the hinge member 37 on the supporting substrate 38, and four electrodes 39 formed on the supporting substrate 38 to face the four electrodes 35. In this example, the drive mechanism can drive the hinge member 37 to swing and tilt by controlling a potential difference between the facing four pairs of electrodes 35 and 39 and thereby controlling an electrostatic force applied between the electrodes. This enables the inclination angle of the reflection surface of the mirror elements 3 supported on the hinge member 37 about the two perpendicular axes to be controlled continuously within a predetermined variable range. The structure of the spatial light modulator 13 is described in detail in, for example, Japanese Laid-Open Patent Publication No. 2002-353105.

The structure of the drive mechanism of the mirror elements 3 is not limited to the structure of the present embodiment and may have any other structure. Further, although the mirror elements 3 are planar mirrors with a substantially regular square shape in the present embodiment, the mirror elements 3 may have any shape, such as a rectangular shape. To achieve high light usage efficiency, it is preferable that the mirror elements 3 are shaped so as to be arranged without gaps therebetween. It is also preferable that the gap between adjacent mirror elements 3 be eliminated. The mirror elements 3 presently have a size of ten square micrometers to several tens of square micrometers. However, it is preferred that the mirror elements 3 be as small as possible to enable fine adjustments of the illumination conditions.

Figure 2C:
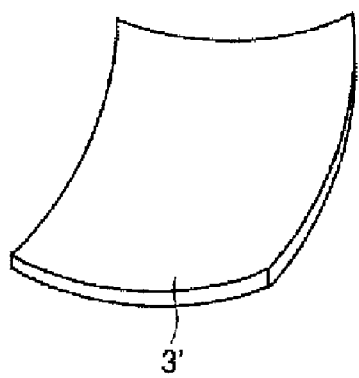
FIG. 2(C) is an enlarged perspective view of a mirror element with a concave surface.

Instead of the mirror element 3, as shown in FIG. 2(C), a mirror element 3' having a concave surface or a mirror element having a convex surface (not shown) may be used.

As the spatial light modulator 13, the spatial light modulators described in, for example, Japanese National Phase Laid-Open Patent Publication No. 10-503300 and its corresponding European Patent Publication No. 779530, Japanese Laid-Open Patent Publication No. 2004-78136 and its corresponding U.S. Pat. No. 6,900,915, Japanese National Phase Laid-Open Patent Publication No. 2006-524349 and its corresponding U.S. Pat. No. 7,095,546, and Japanese Laid-Open Patent Publication No. 2006-113437 may be used. When the spatial light modulator described in these publications is used in the illumination optical system ILS, light through each reflection surface of the spatial light modulator enters an intensity distribution forming optical system (relay optical system 14) at a predetermined angle, and forms a predetermined light intensity distribution on an illumination pupil plane in accordance with a control signal provided to a plurality of mirror elements (reflection elements).

Also, as the spatial light modulator 13, a spatial light modulator that can separately control, for example, the height of its two-dimensionally arranged reflection surfaces may be used. As such a spatial light modulator, the spatial light modulators described in, for example, Japanese Laid-Open Patent Publication No. 6-281869 and its corresponding U.S. Pat. No. 5,312,513, and FIG. 1d of Japanese National Phase Laid-Open Patent Publication No. 2004-520618 and its corresponding U.S. Patent Publication No. 6,885,493 may be used. The spatial light modulator described in these publications forms a two-dimensional height distribution using a plurality of phase elements (optical elements) to have the same effect on the incident light as a phase-type diffraction grating.

The spatial light modulator having the plurality of two-dimensionally arranged reflection surfaces may be modified in accordance with the disclosure of, for example, Japanese National Phase Laid-Open Patent Publication No. 2006-513442 and its corresponding U.S. Pat. No. 6,891,655 or Japanese National Phase Laid-Open Patent Publication No. 2005-524112 and its corresponding U.S. Patent Application Publication No. 2005/0095749.

Figure 3C:
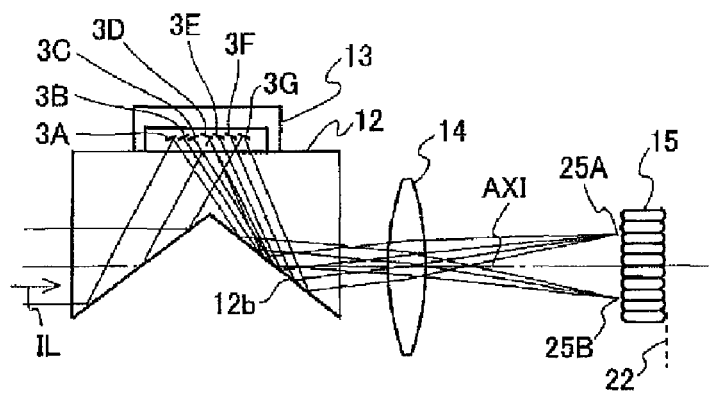
FIG. 3(C) is a diagram showing dipolar illumination performed using light beams from mirror elements having an inclination angle distribution different from the mirror elements of FIG. 3(A)
Figure 3D:
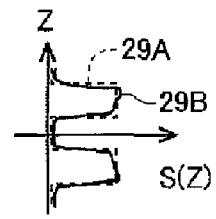
FIG. 3(D) is a diagram showing the intensity distribution of the secondary light sources during dipolar illumination.
Figure 3E:
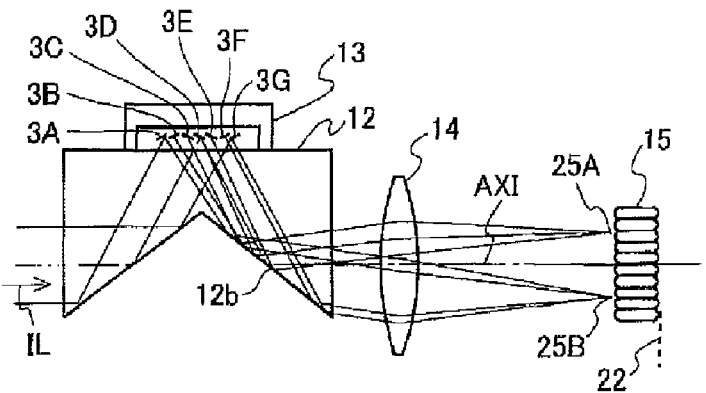
FIG. 3(E) is a diagram showing dipolar illumination performed using light beams from mirror elements having an inclination angle distribution different from the mirror elements of FIGS. 3(A) and 3(C)

The operation of the spatial light modulator 13 will now be described taking for example a case in which the illumination conditions are set to be dipolar illumination and the dipolar secondary light sources 24A and 24B spaced in the z direction in FIG. 3(B) are generated on the illumination pupil plane 22. FIGS. 3(A), 3(C), and 3(E) show reflection light from mirror elements 3A to 3G, which are selected as representatives from several thousand mirror elements 3 arranged in one row in the Y direction included in the spatial light modulator 13 of FIG. 1. For example, to form the dipolar secondary light sources 24A and 24B of FIG. 3(B), the illumination light IL needs to be focused in the two corresponding substantially circular regions 25A and 25B on the incident surface of the fly's eye lens 15. FIG. 3(D) shows one example of the distribution of the light intensity S(Z) on a straight line parallel to the Z axis and extending along the optical axis of the secondary light sources 24A and 24B.

First, as shown in FIG. 3(A), the inclination angle of each of the mirror elements 3A to 3G (actually the inclination angle about two axes) in the spatial light modulator 13 is set, and then the reflection light from the mirror elements is focused in the two regions 25A and 25B of the incident surface of the fly's eye lens 15 after the light travels through the second reflection surface 12b of the prism 12 and the relay optical system 14. As a result, the dipolar secondary light sources 24A and 24B are generated in the Z direction shown in FIG. 3(B). In FIG. 3(A), the mirrors 3A to 3C have the same inclination angle. Thus, reflection light from the mirrors 3A to 3C is focused commonly in the region 25A. The mirrors 3D to 3G have the same inclination angle and are symmetric to the mirrors 3A to 3C. Thus, reflection light from the mirrors 3D to 3G is commonly focused in the region 25B symmetric to the region 25A. The inclination angle of the other mirror elements 3 within the same row of the spatial light modulator 13 about the two axes and the inclination angle of the other mirror elements 3 within another row of the spatial light modulator 13 about the two axes are also set in a manner that the reflection light from these mirror elements is focused in either the region 25A or the region 25B.

In the present embodiment, after m pulses of the illumination light IL are emitted in the state shown in FIG. 3(A), the distribution of inclination angles of the mirror elements 3A to 3G of the spatial light modulator 13 is changed to the state shown in FIG. 3(C). The region 25B is then illuminated with the illumination light IL from the mirror elements 3A to 3C, and the region 25A is illuminated with the illumination light IL from the mirror elements 3D to 3G. In this case, the secondary light sources 24A and 24B on the illumination pupil plane 22 have substantially the same intensity distribution, or in other words, have the same intensity distribution within a predetermined tolerable range (for example, the range in which a projected image of a line and space pattern with a predetermined pitch in the X direction can be resolved), but with different combinations of the mirror elements 3A to 3G that reflect the illumination light IL focused in the regions 25A and 25B. After the m pulses of the illumination light IL are emitted in this state, the distribution of inclination angles of the mirror elements 3A to 3G of the spatial light modulator 13 is changed to the state shown in FIG. 3(E) to illuminate the region 25B with the illumination light IL from the mirror elements 3A, 3B, 3F, and 3G arranged at the two ends and to illuminate the region 25A with the illumination light IL from the mirror elements 3C to 3E arranged in the middle. In this case as well, the secondary light sources 24A and 24B on the illumination pupil plane 22 have substantially the same intensity distribution.

In this manner, whenever m pulses of the illumination light IL are emitted, the combination of the mirror elements 3A to 3G that reflect the illumination light IL focused in the regions 25A and 25B corresponding to the secondary light sources 24A and 24B, and ultimately the distribution of angles of the illumination light IL reflected by the mirror elements 3A to 3G with respect to the optical axis AXI (illumination control pattern) are changed gradually, while the intensity distribution of the secondary light sources 24A and 24B is maintained to be substantially the same. After all predetermined combinations are used, the distribution of inclination angles of the mirror elements 3A to 3G is changed cyclically again to the distributions shown in FIGS. 3(A), 3(C), 3(E), and etc.

Figure 5A:
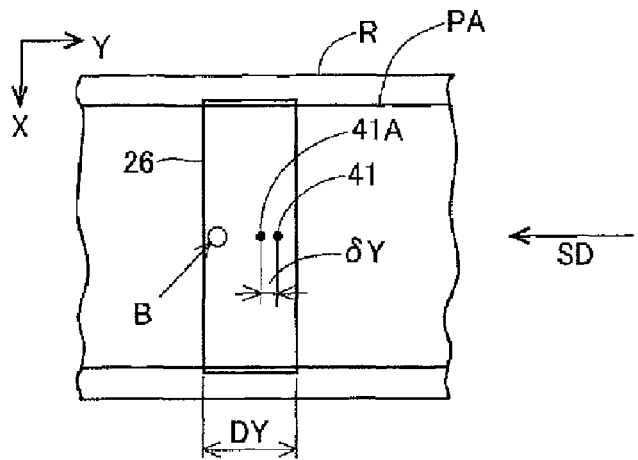
FIG. 5(A) is a diagram showing an illumination region 26 of a reticle R of FIG. 1.
Figure 5B:
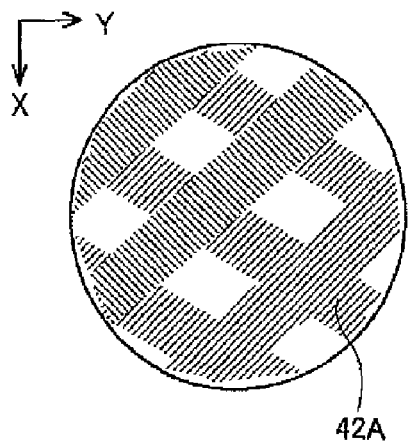
FIG. 5(B) is an enlarged view showing interference fringes in a portion B of FIG. 5(A)
Figure 5C:
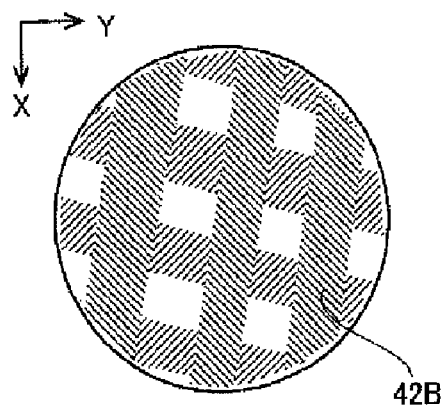
FIG. 5(C) is an enlarged view showing other interference fringes in the portion B of FIG. 5(A)

FIG. 5(A) shows the illumination region 26 of the reticle R in FIG. 1 scanned in the scanning direction SD (−Y direction in one example). In FIG. 5(A), DY indicates the width of the illumination region 26 in the Y-direction, and δY indicates the distance by which a point 41 set freely on the pattern surface of the reticle R moves to a position 41A during pulsed illumination of the illumination light IL. The number of pulses N of the illumination light IL that illuminates the point 41 (exposure pulse number) (N is an integer greater than or equal to 2) is substantially expressed as shown below. The illumination pulse number N is, for example, ten to one hundred.

$$N=DY/\delta Y \quad (2)$$

The combination of the inclination angle distributions of the mirror elements 3A to 3G of the spatial light modulator 13 in FIG. 3(A) changes whenever m pulses of the illumination light IL are emitted. Thus, the number M of the illumination control patterns corresponding to the combinations of the inclination angle distributions of the mirror elements 3A to 3G is only required to be a minimum integer greater than or equal to at least N/m as shown below.

$$M=\text{minimum integer greater than or equal to } N/m \quad (3)$$

When the illumination control pattern is switched whenever one pulse of the illumination light IL is emitted, the number M of the illumination control patterns is at least equal to N.

Each row of the spatial light modulator 13 actually includes several thousand mirror elements 3. Thus, even when, for example, the mirror elements 3 are divided into 100*100 blocks in the X direction and the Y direction and each block of 100*100 mirror elements is controlled to have substantially the same inclination direction and inclination angle, the number of distributions of the mirror elements 3 with different inclination directions and different inclination angles (number M) is as large as substantially the factorial of 10000. In contrast, even when m=1 is satisfied, the value of N/m is as small as ten to one hundred. Expression (3) can therefore be satisfied with relative ease.

As a result, the point 41 freely set on the reticle R in FIG. 5(A) is sequentially subject to dipolar illumination, which is performed by substantially the same secondary light sources 24A and 24B using reflection light from the mirror elements 3 with a different combination of inclination angle distributions in the spatial light modulator 13 whenever m pulses of the illumination light IL are emitted. The dipolar illumination is performed until the N pulses of the illumination light IL are emitted in total. As a result, as shown in for example FIGS. 5(B) and 5(C), which are enlarged views of portion B shown in FIG. 5(A), the same part of the illumination region 26 of the reticle R (and ultimately the corresponding part of the exposure region 27 of the wafer W in FIG. 1) is sequentially illuminated to form fine interference fringes of the illumination light IL with different patterns 42A, 42B, whenever m pulses of the illumination light IL are emitted. As a result, after the point 41 on the reticle R is illuminated with the N pulses of the illumination light IL, the interference fringes are averaged to reduce their effects in the illumination region 26 (illumination variations). Further, the exposure (accumulated exposure) performed at the point on the wafer W corresponding to the reticle R becomes optimal. This greatly reduces exposure variations.

When the secondary light sources 24A and 24B shown in FIG. 3(B) are actually formed, for example, it is preferable that the inclination angle distribution of the mirror elements 3A to 3G is controlled in a manner that the light intensity distribution becomes uniform in a target region as indicated by a curve 29A of the broken line in FIG. 3(D) and becomes substantially 0 in other regions.

Figure 6A:
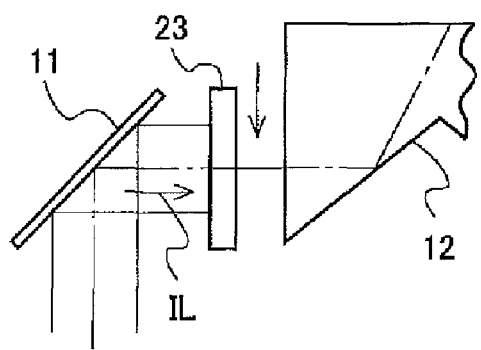
FIG. 6(A) is a diagram showing a photoelectric sensor 23 arranged on an optical path of illumination light IL.
Figure 6B:
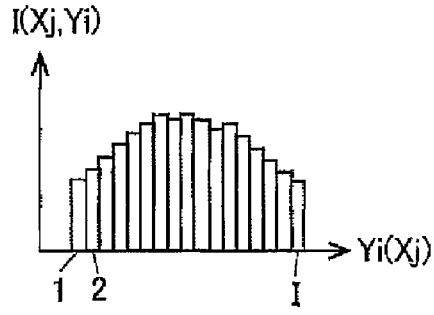
FIG. 6(B) is a diagram showing one example of a luminance distribution of the illumination light IL entering a plurality of mirror elements 3 included in the spatial light modulator 13 of FIG. 1.

However, the cross-sectional intensity distribution of the illumination light IL from the light source 7 is not uniform but may change in a timed manner. When the intensity distribution of the illumination light IL changes, the intensity distribution of the secondary light sources 24A and 24B in FIG. 3(B) changes as indicated by, for example, a curve 29B of the solid line in FIG. 3(D). This slightly unbalances the dipolar illumination and consequently causes illumination variations on the illumination pupil plane 22 (and ultimately in the illumination region 26). To avoid this, the exposure apparatus 100 of the present embodiment includes, for example, the photoelectric sensor 23 arranged in the optical path of the illumination light IL between the mirror 11 and the prism 12 as shown in FIG. 6(A). The illumination light IL is emitted in pulses, and the cross-sectional intensity distribution of the illumination light IL is measured. Information on the intensity ratio of the illumination light IL entering the mirror elements 3 of the spatial light modulator 13 is updated regularly. Further, I(Xj, Yi) indicates the luminance of the illumination light IL entering the mirror element 3 at the i-th position in the X direction (j=1, 2, . . . J) and the i-th position in the Y direction (i=1, 2, . . . , I) of the spatial light modulator 13 shown in FIG. 1. As shown in FIG. 6(B), the modulation control unit 31 in FIG. 1 processes a detection signal from the photoelectric sensor 23 to calculate the distribution of the luminance I(Xj, Yi) entering each mirror element 3, and ultimately the intensity ratio of the illumination light IL entering each mirror element 3, and stores information on the calculated intensity ratio in its internal storage. Subsequently, the modulation control unit 31 selects an illumination control pattern with which the intensity distribution of the secondary light sources becomes closer to the curve 29A in FIG. 3(D) from usable combinations of inclination angle distributions of the mirror elements 3 of the spatial light modulator 13 based on the updated intensity ratio. As described above, the modulation control unit 31 then controls the mirror elements 3 of the spatial light modulator 13 whenever m pulses of the illumination light IL are emitted. This control enables dipolar illumination to be performed with high accuracy and reduced illumination variations.

Figure 4B:
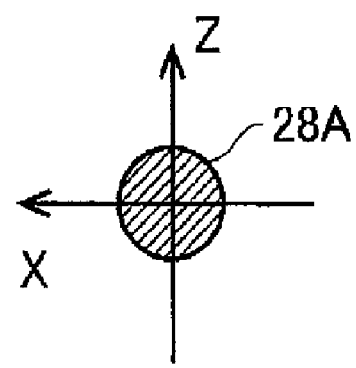
FIG. 4(B) is a diagram showing a secondary light source during normal illumination.
Figure 4C:
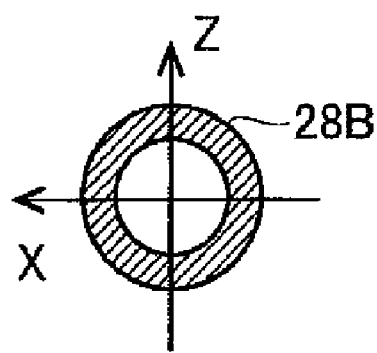
FIG. 4(C) is a diagram showing secondary light sources during annular illumination.
Figure 4D:
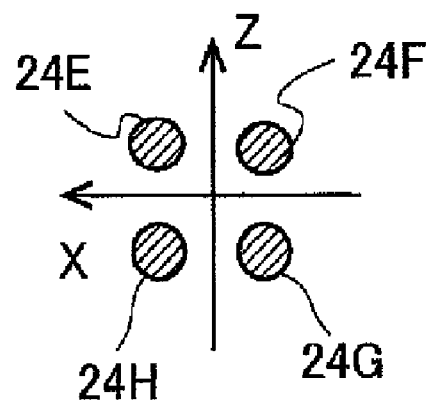
FIG. 4(D) is a diagram showing a secondary light source during quadrupolar illumination.

In the same manner, during dipolar illumination in the X direction shown in FIG. 4(A), normal illumination shown in FIG. 4(B), annular illumination shown in FIG. 4(C), and quadrupolar illumination shown in FIG. 4(D), the modulation control unit 31 also changes the combination of the mirror elements 3 of the spatial light modulator 13 for reflecting the illumination light IL and focusing the light into each part of the secondary light sources on the illumination pupil plane 22 in the same manner as described above whenever m pulses of the illumination light IL are emitted. This gradually changes the pattern of the fine interference fringes formed in the illumination region 26 (exposure region 27) by the illumination light IL and reduces the exposure variations at each point on the wafer W after the scanning exposure.

This embodiment has the advantages described below.

(1) The illumination optical system ILS in the exposure apparatus 100 of FIG. 1 according to the present embodiment is an illumination optical apparatus that illuminates the reticle surface (irradiated plane) with the illumination light IL, which is emitted in pulses. The illumination optical system ILS includes the spatial light modulator 13 (optical device) arranged upstream from the reticle surface (toward the light source for the illumination light IL) and including the plurality of mirror elements 3 (optical elements) for controlling the angle of the illumination light IL to the optical axis AXI in accordance with the incident position of the illumination light IL, and the modulation control unit 31 (illumination control system) for controlling the plurality of mirror elements 3 whenever at least one pulse of the illumination light IL is emitted in a manner that each mirror element 3 reflects the illumination light IL at a different angle and forms substantially the same intensity distribution of the reflected illumination light on the illumination pupil plane 22 (predetermined plane).

In the present embodiment, the plurality of mirror elements 3 of the spatial light modulator 13 separately controls (spatially modulates) the angle of the illumination light IL to control the intensity distribution of the illumination light IL on the incident surface of the fly's eye lens 15, and ultimately the light intensity distribution on the illumination pupil plane 22, which serves as the emission surface of the fly's eye lens 15, and to control the illumination conditions, while maintaining high usage efficiency of the illumination light IL. Also, when at least one pulse of the illumination light IL is emitted during a single scanning exposure operation, the angle of light from each of the plurality of mirror elements 3 is changed in a manner that the angles are in different combinations, while substantially the same intensity distribution is maintained on the illumination pupil plane 22. As a result, the interference fringes are averaged to reduce effects of illumination variations with the laser light (illumination light IL) emitted from the laser light source. Also, the spatial light modulator 13 functions both as a light intensity distribution forming member and an illumination variation reducing member, and prevents the structure of the illumination optical system ILS from being complicated.

(2) In the embodiment shown in FIG. 1, the illumination pupil plane 22 is set as a predetermined plane, and the intensity distribution of the illumination light IL on the illumination pupil plane 22 is controlled. This enables the illumination conditions to be controlled correctly. Alternatively, a plane conjugated with the illumination pupil plane 22 may be set as a predetermined plane. Further, a plane near the illumination pupil plane 22 or a plane near the conjugated plane of the illumination pupil plane 22 may be set as a predetermined plane, and the light intensity distribution may be controlled on such a predetermined plane.

When the fly's eye lens 15 is used, the light intensity distribution on the incident surface of the fly's eye lens 15 becomes substantially the same as the light intensity distribution on the emission surface of the fly's eye lens 15 (illumination pupil plane 22). Thus, the incident surface of the fly's eye lens 15 or a plane near the incident surface may be set as a predetermined plane.

(3) In the embodiment shown in FIG. 1, the spatial light modulator 13 including the plurality of mirror elements 3 (reflection elements) having reflection surfaces with variable inclination angles that reflect the illumination light IL is used as an optical device including a plurality of optical elements. When the reflection surfaces are used, the usage efficiency of the illumination light IL is high.

(4) Also, the reflection surface of each mirror element 3 of the spatial light modulator 13 of FIG. 1 has a variable inclination angle about two perpendicular axes. Thus, reflection light from each mirror element 3 can be guided to any two-dimensional position on the incident surface of the fly's eye lens 15 and ultimately on the illumination pupil plane 22 through the prism 12 and the relay optical system 14. This enables any illumination conditions to be set with high accuracy while maintaining substantially 100% usage efficiency of the illumination light IL.

Only the inclination angle of each mirror element 3 about at least one axis (for example, an axis parallel to the X axis in FIG. 1) needs to be controlled. When only the inclination angle about a single axis is controlled, the reflection light from the plurality of mirror elements 3 in each row of the spatial light modulator 13 only needs to be focused in any region of the corresponding row on the incident surface of the fly's eye lens 15. Also, when the corresponding row includes no region in which the illumination light IL is to be focused, the inclination angle of the mirror elements 3 in the row may be set in a manner that the reflection light from these mirror elements 3 does not reach the incident surface of the fly's eye lens 15. This simplifies the control of the spatial light modulator 13, although lowering the usage efficiency of the illumination light IL to some extent.

(5) Instead of the spatial light modulator 13, a liquid crystal cell including a plurality of pixels (transmissive elements) that control the amount of transmission light may be used. In this case, the spatial modulation is achieved by controlling the transmission rate of light traveling through each pixel.

(6) Also, instead of the spatial light modulator 13, a spatial light modulator including a plurality of phase elements (variable step elements) each for controlling the phase of transmission light may be used. The spatial light modulator including the phase elements functions as a diffractive optical element having a variable diffractive pattern.

(7) The illumination optical system ILS of FIG. 1 includes the prism 12 (optical member) arranged near the spatial light modulator 13. The prism 12 has the first reflection surface 12a (first surface) for deflecting the direction in which the illumination light IL enters the plurality of mirror elements 3 (toward the mirror elements 3) and the second reflection surface 12b (second surface) for deflecting the reflection light in a direction in which the reflection light enters the irradiated plane (reticle surface) through the plurality of mirror elements 3.

This enables the optical components forming the illumination optical system ILS to be arranged along a single straight line, or on a line bent by 90°. Thus, the illumination optical system ILS can be designed and manufactured easily.

(8) The illumination optical system ILS of FIG. 1 includes the photoelectric sensor 23 for measuring the intensity distribution of the illumination light IL entering the plurality of mirror elements 3. The modulation control unit 31 switches the state of angles of light from the mirror elements 3 based on the intensity distribution measured using the photoelectric sensor 23 in a manner that the intensity distribution of the illumination light IL on the predetermined plane satisfies a predetermined uniformity condition. Thus, even when the cross-sectional intensity distribution of the illumination light IL changes, illumination variations on the illumination pupil plane 22 and ultimately illumination variations on the reticle surface can be reduced.

(9) The illumination optical system ILS includes the rotatable half-wavelength plate 9 and the depolarizer 10 (polarization control optical system) arranged at the incident side of the spatial light modulator 13 and can control the polarization state of the illumination light IL whenever k pulses of the illumination light IL are emitted. Thus, when, for example, a spatial light modulator like the spatial light modulator 13 is used instead of the reticle R of FIG. 1 to switch the pattern that is subject to transfer at a high speed whenever the predetermined number of pulses of the illumination light IL are emitted, the intensity distribution of the secondary light sources is switched by the spatial light modulator 13 in accordance with the switched pattern and at the same time the state of the polarized illumination can be switched sequentially at a high speed. This enables various patterns to be exposed onto the wafer by a single exposure operation under optimal illumination conditions (with the intensity distribution of the secondary light sources and the polarized illumination in one example).

(10) Also, the illumination light IL emitted to the half-wavelength plate 9 is substantially linearly polarized. The rotation angle of the half-wavelength plate 9 about the optical axis AXI (or an axis parallel to the optical axis AXI) is variable. Thus, simply controlling the rotation angle of the half-wavelength plate 9 enables the polarization state of the illumination light IL on the reticle surface (upper surface of the wafer W) to be set as a linearly polarized state in the X direction or the Y direction, or as a linearly polarized state in a diagonal direction. Further, the use of the depolarizer 10 enables the polarization state of the illumination light IL to be set as a nonpolarized state.

(11) In the above-described embodiment, the illumination pulse number of the illumination light IL illuminating each point of the reticle surface is assumed to be N (N is an integer greater than or equal to 2). Whenever m pulses of the illumination light IL (m is an integer greater than or equal to 1) are emitted, the combination of inclination angles of the mirror elements 3, and ultimately the distribution of angles of the illumination light IL from the mirror elements 3 (illumination control pattern) are switched among M combinations or distributions, as defined by expression (3). In this case, the combination of inclination angles of the mirror elements 3 of the spatial light modulator 13 only needs to be set cyclically to correspond to one of the M illumination control patterns. This simple setting enables a different pattern of fine interference fringes to be formed whenever m pulses of the illumination light IL are emitted during a single scanning exposure operation. As a result, illumination variations caused by such interference fringes, and ultimately exposure variations are reduced efficiently.

The inclination angles of the mirror elements (and ultimately illumination control patterns) may be in N combinations. In this case, simply switching the combination of inclination angles of the mirror elements 3 cyclically to one of the N combinations of inclination angles of the mirror elements 3 whenever one pulse of the illumination light IL is emitted enables a different pattern of fine interference fringes to be formed whenever one pulse of the illumination light IL is emitted during one scanning exposure operation. This greatly reduces illumination variations, and ultimately reduces exposure variations caused by such interference fringes.

(12) The illumination optical system ILS of FIG. 1 includes the fly's eye lens 15 (optical integrator) for illuminating the reticle surface with the illumination light IL from the illumination pupil plane 22 in a superimposed manner. This improves the uniformity of the illumination distribution on the reticle surface.

(13) Also, the illumination optical system ILS includes the light source 7 for emitting the illumination light IL to the illumination optical system ILS, the power supply control unit 32, and the main control system 30. As a result, the timing of pulsed illumination of the light source 7 is easily controlled with high accuracy.

(14) The exposure apparatus 100 of the above-described embodiment projects an image of the reticle surface (first surface) onto the upper surface (second surface) of the wafer W, and includes the illumination optical system ILS for illuminating the reticle surface with the illumination light IL that is emitted in pulses, and the projection optical system PL for forming an image of the reticle surface on the wafer W based on light from the illumination region 26 formed on the reticle surface with the illumination optical system ILS. In this case, the pattern of fine interference fringes formed by the illumination light IL illuminating the reticle surface from the illumination optical system ILS gradually changes to a different pattern whenever, for example, m pulses of the illumination light IL are emitted. This reduces exposure variations (accumulated exposure variations) on the wafer W after the exposure, and enables a device to be eventually manufactured with high accuracy.

The above-described embodiment may be modified in the following forms.

(1) The exposure apparatus 100 of the above-described embodiment performs scanning exposure is of a scanning exposure type and thus the effects of illumination variations caused by interference fringes of the illumination light IL are reduced by scanning exposure. The illumination optical system ILS of the above-described embodiment may also be applied to a step-and-repeat type exposure apparatus, such as a stepper. In this case, the wafer stage WST shown in FIG. 1 only needs to function to step-move in the X direction and the Y direction. When the exposure apparatus performs exposure using a step-and-repeat technique, the apparatus cannot benefit from scanning exposure that reduces illumination variations. Even in this case, the illumination optical system ILS described above gradually reduces illumination variations on the reticle surface (irradiated plane) and ultimately exposure variations (accumulated exposure variations) by gradually changing the pattern of fine interference fringes of the illumination light IL illuminating the reticle surface to a different pattern whenever m pulses of the illumination light IL are emitted. Thus, the present invention is especially advantageous when applied to an exposure apparatus using a step-and-repeat technique.

(2) Instead of the fly's eye lens 15 of FIG. 1, which is a wavefront divisional type integrator, a rod-type integrator can be used as an inner surface reflection type optical integrator.

Figure 7A:
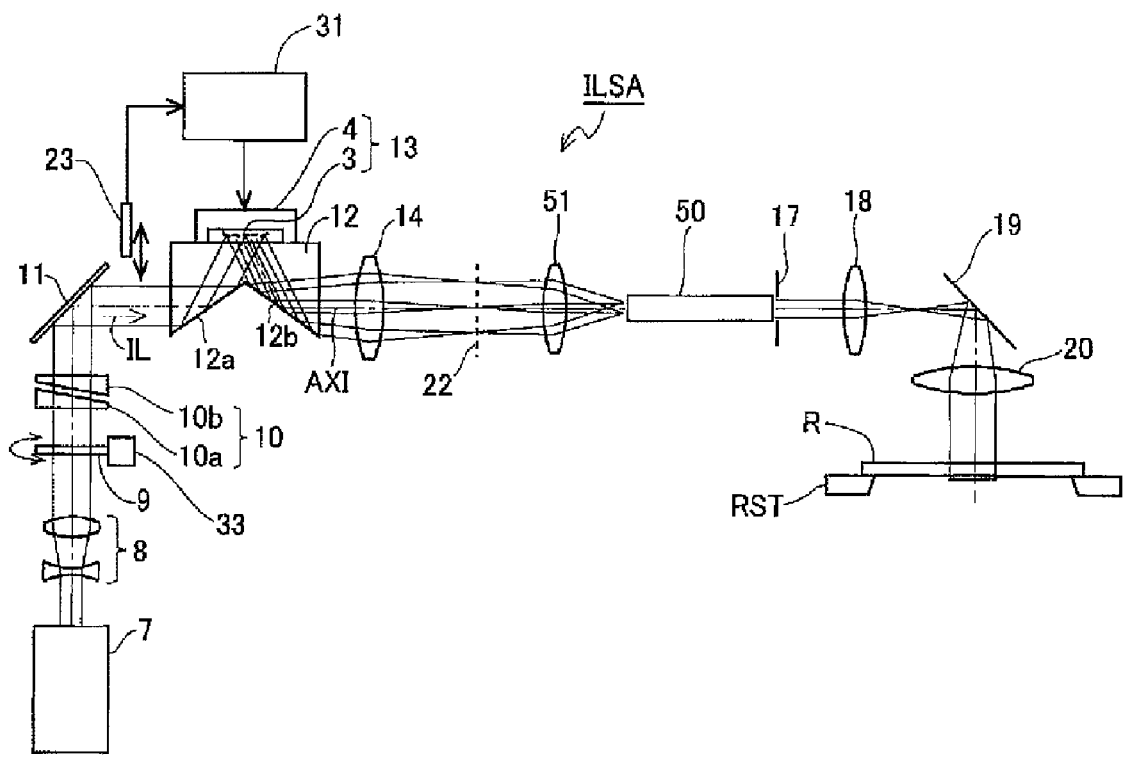
FIG. 7(A) is a diagram showing one example of the structure of an illumination optical system formed using a rod-type integrator 50.

In this case, as shown FIG. 7(A), in an illumination optical system ILSA, a condenser optical system 51 is additionally arranged toward the reticle R from the relay optical system 14 to form a conjugated plane of the reflection surface of the spatial light modulator 13 (reflection surface of the mirror elements 3) and to arrange the rod-type integrator 50 so that the incidence end is positioned near the conjugated plane.

Further, the illumination optical system ILSA includes a relay optical system (a relay lens 18, a mirror 19, and a condenser optical system 20) for forming on the reticle R an image of a reticle blind 17 (field stop), which is arranged on or near an emission end surface of the rod-type integrator 50. The remaining structure of the illumination optical system ILSA is the same as the structure of the illumination optical system ILS of FIG. 1. In the structure shown in FIG. 7(A), secondary light sources are formed on a pupil plane 22 of the relay optical system 14 and the condenser optical system 51 (virtual image of the secondary light source is formed near the incidence end of the rod-type integrator 50).

Figure 7B:
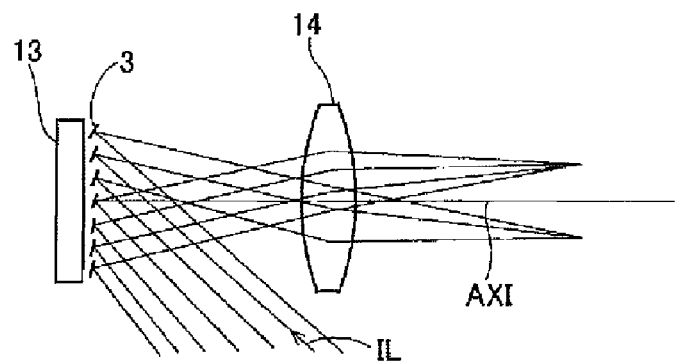
FIG. 7(B) is a diagram showing essential parts of an illumination optical system formed without using a prism.

(3) Although the illumination optical system ILS of FIG. 1 employs the prism 12, a mirror having reflection surfaces 12a and 12b may be arranged in an optical path of the illumination light IL instead of the prism 12. Further, as shown in FIG. 7(B), the prism 12 may be eliminated. In the structure shown in FIG. 7(B), the illumination light IL is emitted to the plurality of mirror elements 3 of the spatial light modulator 13 in a direction diagonal to the plurality of mirror elements 3. The illumination light IL reflected by the plurality of mirror elements 3 travels along the optical axis AXI to a fly's eye lens (not shown) through the relay optical system 14.

Figure 8:
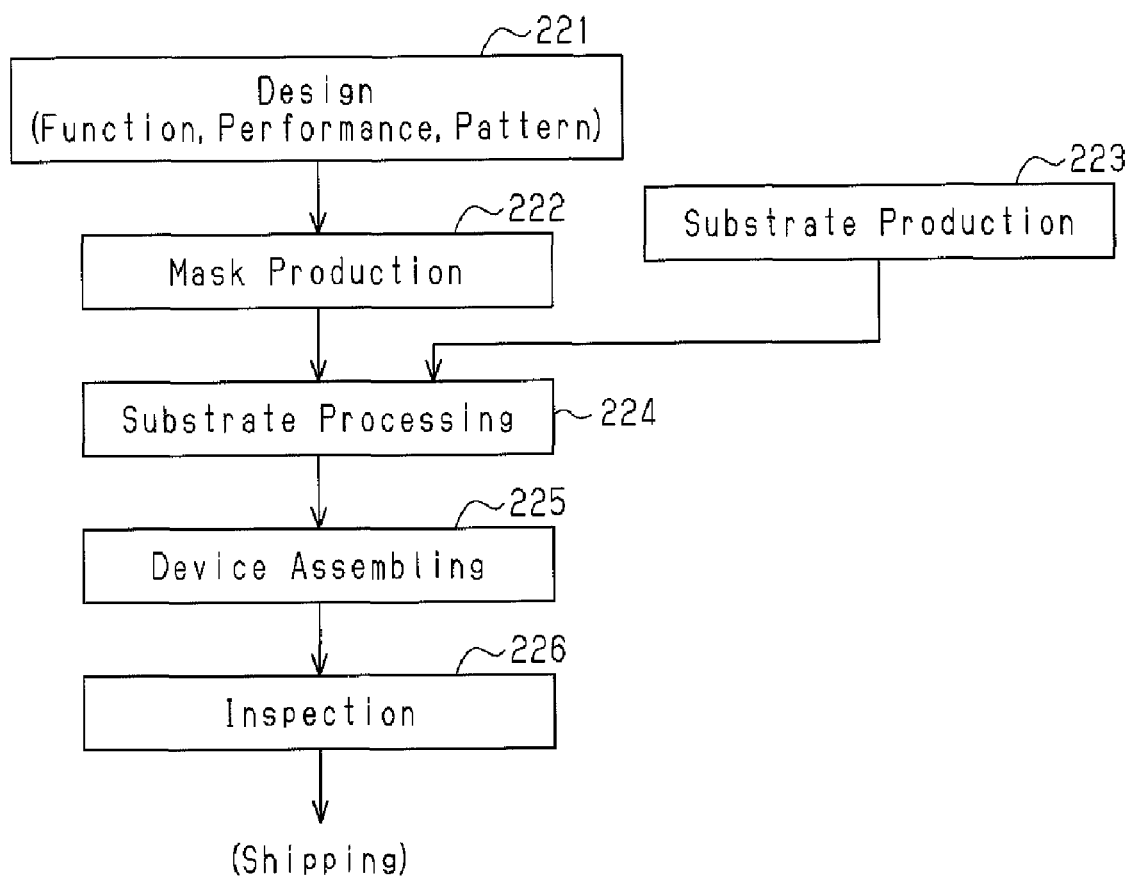
FIG. 8 is a flowchart showing one example of a process for manufacturing a device using the exposure apparatus according to the embodiment.

When a device (electronic device or micro-device) such as a semiconductor device is manufactured using the exposure apparatus of the above-described embodiment, as shown in FIG. 8, the device is manufactured by carrying out step 221 for designing the functions and performance of the device, step 222 for producing a mask (reticle) based on the designing step, step 223 for manufacturing a substrate (wafer) serving as the base material of the device, substrate processing step 224 including a process for exposing a pattern of the mask onto the substrate with the exposure apparatus 100 (projection exposure apparatus) of the above-described embodiment, a process for developing the exposed substrate, and a process for heating (curing) and etching the developed substrate, a device assembling step (processes including dicing, bonding, and packaging) 225, an inspection step 226, and the like.

In other words, this device manufacturing method includes a process for exposing the wafer W with the exposure apparatus 100 of the above embodiment and a process (step 224) for processing the exposed wafer W.

The device manufacturing method further includes a lithography process, in which the exposure apparatus 100 is used. This device manufacturing method reduces exposure variations and enables a device to be manufactured with high accuracy.

The present invention may be applied to a liquid immersion type exposure apparatus disclosed in, for example, PCT Publication No. 99/49504. The illumination optical apparatus of the present invention may be applied to, for example, a proximity type exposure apparatus that does not use a projection optical system.

The application of the present invention is not limited to a semiconductor device manufacturing process. The present invention may be widely applied to, for example, a process for manufacturing a liquid display device, a plasma display, or the like and a process for manufacturing various types of devices (electronic devices) such as an imaging device (CMOS type device, CCD, etc.), a micro-machine, microelectromechanical systems (MEMS), a thin film magnetic head, a DNA chip, or the like. The present invention should not be limited to the above-described embodiment, but may be modified variously without departing from the scope and spirit of the present invention.

What is claimed is:

1. An illumination optical apparatus for illuminating a pattern arranged on an irradiated plane with a plurality of pulses of light, the illumination optical apparatus comprising:
   an optical device arranged upstream from the irradiated plane and including a plurality of optical elements, each of which spatially modulates the pulses of light in accordance with incident positions of the pulses of light; and
   an illumination control system which controls the plurality of optical elements, whenever at least one pulse of light is emitted, in a manner such that the optical elements spatially modulate the plurality of pulses of light differently from one another; and
   a relay optical system arranged downstream from the optical device and changing distribution of angles of incident light to distribution of positions of exit light, wherein the relay optical system guides the plurality of pulses of light spatially modulated by the optical elements to a predetermined plane, which is an illumination pupil plane of the illumination optical system or a plane optically conjugated with the illumination pupil plane.

2. The illumination optical apparatus according to claim 1, wherein:
   each of the optical elements is a reflective element; and
   the reflective element includes a reflection surface which reflects the pulse of light and has a variable inclination angle.

3. The illumination optical apparatus according to claim 2, wherein the inclination angle of the reflection surface about at least one axis is adjustably set within a variable range.

4. The illumination optical apparatus according to claim 1, wherein each of the optical elements is a transmissive element.

5. The illumination optical apparatus according to claim 1, wherein each of the optical elements is a phase element.

6. The illumination optical apparatus according to claim 1, further comprising:
   an optical member arranged near the optical device and including a first surface, which deflects each pulse of light in a direction for entering the plurality of optical elements, and a second surface, which deflects each pulse of light traveling through the plurality of optical elements in a direction for entering the irradiated plane.

7. The illumination optical apparatus according to claim 6, wherein the optical member includes a prism.

8. The illumination optical apparatus according to claim 1, further comprising:
   a photoelectric sensor which measures an intensity distribution of the pulses of light entering the plurality of optical elements;
   wherein the illumination control system controls the plurality of optical elements based on the intensity distribution measured by the photoelectric sensor so that the intensity distribution of the pulses of light on the predetermined plane satisfies a predetermined uniformity condition.

9. The illumination optical apparatus according to claim 1, further comprising:
a polarization control optical system arranged at an incident side of the plurality of optical elements which controls a polarization state of the pulses of light whenever a predetermined number of pulses of light are emitted.

10. The illumination optical apparatus according to claim 9, wherein:
each of the pulses of light emitted to the polarization control optical system is substantially linearly polarized; and
the polarization control optical system includes a half-wavelength plate having a rotation angle adjustably set about an optical axis or an axis substantially parallel to the optical axis.

11. The illumination optical apparatus according to claim 1, further comprising:
an optical integrator arranged on the predetermined plane.

12. The illumination optical apparatus according to claim 11, further comprising an optical system arranged downstream from the predetermined plane and guiding the pulses of light that have traveled via the predetermined plane, to the irradiated plane.

13. The illumination optical apparatus according to claim 1, wherein:
the irradiated plane is irradiated by N pulses of light, where N is an integer greater than or equal to 2; and
the illumination optical system controls the plurality of optical elements whenever m pulses of light are emitted, where m is an integer greater than or equal to 1; and
the illumination control system includes at least N or N/m illumination control patterns.

14. The illumination optical apparatus according to claim 1, further comprising:
a light source for emitting the pulses of light.

15. An exposure apparatus for projecting an image of a first plane onto a second plane, the exposure apparatus comprising:
the illumination optical apparatus according to claim 1 which illuminates the first plane with a pulse of light; and
a projection optical system which forms an image of the first plane on the second plane based on light from an illumination region formed on the first plane by the illumination optical apparatus.

16. The illumination optical apparatus according to claim 15, wherein the projection optical system includes an aperture stop, and the predetermined plane is at a location conjugated with the aperture stop.

17. A method for manufacturing a device, the method comprising:
exposing an object using the exposure apparatus according to claim 15; and
processing the exposed object.

18. The illumination optical apparatus according to claim 1, wherein the illumination control system controls the plurality of optical elements in a manner such that the plurality of pulses of light have substantially a same intensity distribution on the predetermined plane.

19. A method for exposing an image of a pattern arranged on a first plane onto an object arranged on a second plane with a plurality of pulses of light, the method comprising:
spatially modulating pulses of light in accordance with incident positions of the pulses of light, wherein the spatially modulating includes spatially modulating the plurality of pulses of light differently from one another by a plurality of optical elements whenever at least one pulse of light is emitted;
guiding the pulses of light that have been spatially modulated through an optical system, which converts distribution of angles of incident light to distribution of positions of exit light, to a predetermined plane to form a given intensity distribution of light on the predetermined plane;
guiding the pulses of light that have traveled via the predetermined plane, to the first plane; and
using a projection optical system to form an image of the pattern arranged on the first plane onto the second plane, wherein the predetermined plane is a plane conjugated with an aperture stop of the projection optical system.

20. A method for manufacturing a device, the method comprising:
exposing an object in accordance with the method according to claim 19; and
processing the exposed object.

* * * * *